(12) United States Patent
Yuri et al.

(10) Patent No.: US 7,525,814 B2
(45) Date of Patent: Apr. 28, 2009

(54) WIRING BOARD AND METHOD FOR MANUFACTURING THE SAME

(75) Inventors: Shinji Yuri, Kasugai (JP); Masaki Muramatsu, Komaki (JP)

(73) Assignee: NGK Spark Plug Co., Ltd., Aichi (JP)

( * ) Notice: Subject to any disclaimer, the term of this patent is extended or adjusted under 35 U.S.C. 154(b) by 86 days.

(21) Appl. No.: 11/447,018

(22) Filed: Jun. 6, 2006

(65) Prior Publication Data

US 2006/0283547 A1 Dec. 21, 2006

(30) Foreign Application Priority Data

Jun. 15, 2005 (JP) ............... 2005-175422
Mar. 28, 2006 (JP) ............... 2006-087568

(51) Int. Cl.
*H05K 1/18* (2006.01)

(52) U.S. Cl. .................. 361/761; 361/306.3; 361/765; 361/794; 361/795

(58) Field of Classification Search ... 361/306.1–306.3, 361/765–766, 794–795
See application file for complete search history.

(56) References Cited

U.S. PATENT DOCUMENTS 6,512,182 B2 * 1/2003 Takeuchi et al. ............ 174/256
6,724,638 B1 * 4/2004 Inagaki et al. .............. 361/763
6,809,268 B2 * 10/2004 Hayashi et al. ............. 174/260
6,876,554 B1 4/2005 Inagaki et al.
6,979,890 B2 12/2005 Kambe et al.
7,002,075 B2 2/2006 Kambe et al.
2004/0009335 A1 1/2004 Kojima et al.
2004/0160751 A1 8/2004 Inagaki et al.
2005/0157478 A1 7/2005 Inagaki et al.

FOREIGN PATENT DOCUMENTS

| JP | 2002-100875 | 4/2002 |
|---|---|---|
| JP | 2002-204045 | 7/2002 |
| JP | 2002-237683 | 8/2002 |
| JP | 2004-031812 | 1/2004 |
| JP | 2004-349672 | 12/2004 |
| JP | 2005-039217 | 2/2005 |
| JP | 2005-039243 | 2/2005 |

* cited by examiner

*Primary Examiner*—Tuan T Dinh
(74) *Attorney, Agent, or Firm*—Stites & Harbison, PLLC; Ross F. Hunt, Jr.; Jeffrey A. Haeberlin

(57) ABSTRACT

A wiring board includes a plurality of via pads disposed on a ceramic sub-core accommodated in a core board. A Cu-plated layer is formed on the surface of a conductor pad and serves as a processed face, i.e., a face to which Cu surface chemical processing is applied in order to improve the adhesion between the surface of the Cu-plated layer and that of an adjacent polymer material. The lowermost dielectric layer of a laminated wiring portion, and a via conductor formed in the dielectric layer, are in electrical contact with the processed face.

16 Claims, 14 Drawing Sheets

○ 7s: Signal terminal
● 7a: Power terminal
◉ 7b: Ground terminal

STEP 1

STEP 2

STEP 3

STEP 4

STEP 5

STEP 6

STEP 7

STEP 8

STEP 9

STEP C1

STEP C2

STEP C3

STEP C4

STEP C5

STEP C6

12A

12B

WIRING BOARD AND METHOD FOR MANUFACTURING THE SAME

TECHNICAL FIELD

The present invention relates to a wiring board comprised of a core board which accommodates a ceramic sub-core therein, and to a method for manufacturing the wiring board.

BACKGROUND OF THE INVENTION

Conventionally, a wiring board for mounting a semiconductor integrated circuit component (hereinafter referred to as "IC chip") includes a capacitor in order to reduce switching noise of the IC chip and to stabilize the associated operational power supply voltage. When providing the capacitor in the wiring board, the capacitor is preferably formed near the IC chip, because the longer the wiring between the IC chip and the capacitor, the greater the increase in the inductive component of the wiring, thereby resulting in a decrease in the effectiveness of the addition of the capacitor. In this regard, Japanese Patent Application Laid-Open (kokai) No. 2005-39243 discloses a wiring board having a structure wherein a ceramic sub-core incorporating a capacitor therein is accommodated in a core board which is located directly under the IC chip.

SUMMARY OF THE INVENTION

First, addressing certain problems solved by embodiments of the invention with respect to wiring boards including a such ceramic sub-core incorporating a capacitor therein, the sub-core typically has a conductor pad, at a main surface thereof, which is connected to the capacitor. However, a roughening technique or the like, which is used for forming a laminated wiring portion of the wiring board, cannot be applied to the conductor pad due to a difference in materials between those used for a conductor pattern and a via conductor formed in the laminated wiring portion, and those used for the conductor pad. When the laminated wiring portion is formed on a core board accommodating the ceramic sub-core, there is insufficient adhesion between a dielectric layer of the laminated wiring portion, the via conductor formed in the dielectric layer and the conductor pad of the ceramic sub-core. Therefore, a defect in the wiring board is likely to occur during the manufacturing process therefor or in the finished product.

An important aspect of the present invention concerns providing a solution to the above-described problems, and one object of the invention is to provide a wiring board that provides sufficient adhesion between a dielectric layer of the laminated wiring portion, the via conductor formed in the dielectric layer and the conductor pad of the ceramic sub-core, in a construction wherein the laminated wiring portion is formed on the core board which accommodates the ceramic sub-core therein. Another object is to provide a method for manufacturing such a wiring board.

In order to solve the above-described problems, in accordance with one aspect of the present invention, there is provided a wiring board comprising:

a core board having a major surface and comprising a core main body comprised of a sheet of polymer material and a ceramic sub-core formed of a sheet of ceramic, said core board including a sub-core housing portion comprising one of (i) a through-hole penetrating both major surfaces of the core board and (ii) a concave portion open at one of the major surface of the core board, said ceramic sub-core being received in said sub-core housing portion; and a laminated wiring portion disposed on one of the major surfaces of the core board and comprising a plurality of dielectric layers comprised of a polymer material and a plurality of conductor layers alternating with said dielectric layers such that the laminated wiring portion comprises alternating dielectric and conductor layers;

the ceramic sub-core including a capacitor and a conductor pad formed on one major surface thereof and electrically connected to said capacitor, the wiring board further comprising a Cu-plated layer formed on a surface of the conductor pad and including a processed face processed by surface chemical processing so as to enhance adhesion between the processed face of the Cu-plated layer and the polymer material of said dielectric layers, and a lowermost dielectric layer of the laminated wiring portion, and a via conductor formed in the lowermost dielectric layer, being in electrical contact with the processed face.

Further, in accordance with a further aspect of the invention, there is provided a method for manufacturing a wiring board, wherein the wiring board comprises: a core board having two major surfaces and comprising a core main body comprised of a sheet of polymer material, and a ceramic sub-core formed of a sheet of ceramic material, said core board including a sub-core housing portion comprising one of (i) a through-hole penetrating both major surfaces of the core board and (ii) a concave portion open at one of the major surfaces of the core board and, said ceramic sub-core being received in said sub-core housing portion; and a laminated wiring portion disposed on one of the major surfaces of the core board and comprising a plurality of dielectric layers comprised of a polymer material and a plurality of conductor layers alternating with said dielectric layers such that the laminated wiring portion comprises alternating dielectric and conductor layers; the ceramic sub-core including a capacitor, and a conductor pad formed on one main surface thereof and electrically connected to said capacitor, the method comprising the steps of:

housing the ceramic sub-core in the sub-core housing portion;

alternately laminating one layer of a plurality of dielectric layers and one layer of a plurality of conductor layers on a major surface of the core board at which the ceramic sub-core is housed; and using surface chemical processing applied to a Cu-plated layer formed on a surface of the conductor pad so as to improve adhesion between said conductor pad and the polymer material of said dielectric layers.

According to a preferred embodiment of the present invention, the Cu-plated layer is formed on the surface of the conductor pad so that the adhesion is improved between the pad and a via conductor (usually formed by the same Cu plating) formed in the lowermost dielectric layer of the laminated wiring portion. In addition to this, the surface of the Cu-plated layer serves as a processed face at which surface chemical processing is applied to thereby improve the adhesion between the pad and the lowermost dielectric layer of the laminated wiring portion. Thus, since the conductor pad more firmly adheres to the dielectric layer and the via conductor, a defect is unlikely to occur during the manufacturing process or in the finished product. It is noted that the Cu-plated layer can be produced in such a manner that the Cu-plated layer is formed on the surface of the conductor pad of the ceramic sub-core before the sub-core housing step (e.g., using a pad plating step).

Further, in order to obtain the above-described advantages, the conductor pad is preferably formed of a metal material comprised mainly of a metal other than Cu (e.g., at least one metal chosen from Ag, Pt, Au, Ni, Mo or W). When the conductor pad is formed of such a metal material, the Cu-plated layer is necessarily applied thereto, because the above-mentioned surface chemical processing cannot be directly applied, and thus the above-described effect cannot be obtained. On the other hand, when the conductor pad is comprised mainly of Cu and a further metal material, and has a lower Cu content than that of the Cu-plated layer, the pad is still effective in obtaining the effect described above. That is, by using a Cu-plated layer having a higher Cu content than that of the conductor pad, on the surface of the conductor pad (which, e.g., is comprised of Cu metallization), the adhesion to the dielectric layer achieved by surface chemical processing may be further improved, as compared with a technique wherein the surface chemical processing is directly applied to the conductor pad.

According to a first embodiment of the surface chemical processing used in accordance with this aspect of the present invention, a Cu surface chemical processing may be applied to the surface of the Cu plated layer to form a roughened face (also referred to as a processed face). A known method, such as a microetching method or a black oxide treatment, can be used for the Cu roughening process. By forming the surface of the Cu-plated layer as a roughened face, sufficient adhesion can be obtained between the pad and the lowermost dielectric layer of the laminated wiring portion or the via conductor formed in the dielectric layer. This adhesion is due to an anchor effect.

Alternatively, according to a second embodiment of the surface chemical processing used in accordance with this aspect of the present invention, a bonding layer comprised of an alloy containing Cu and Sn is formed on the surface of the Cu-plated layer to thereby form a bonding layer formation face (also referred to as a processed face) thereon. According to this embodiment, the adhesion between the pad and the lowermost dielectric layer of the laminated wiring portion may be sufficient without roughening the surface of the Cu-plated layer. Preferably, the bonding layer can be comprised of an alloy containing a third metal (preferably at least one chosen from Ag, Zn, Al, Ti, Bi, Cr, Fe, Co, Ni, Pd, Au and Pt) in addition to Cu and Sn.

According to a first embodiment of the capacitor incorporated into the ceramic sub-core as used in this aspect of the present invention, the ceramic sub-core includes a thin film capacitor at one major surfaces side. The thin film capacitor comprises plural first electrode conductor thin films and plural second electrode conductor thin films. The conductor thin films which are separated or isolated from each other in terms of direct current flow, and are alternately layered by sandwiching the dielectric thin films therebetween. Thereafter, the conductor pad provided on the surface of the thin film capacitor is formed by a film formation layer principally comprised of Ag, Pt or Au, and the Cu-plated layer is formed thereon. Such a thin film capacitor may be manufactured by, for example, repeating a patterning process based on conventional film formation technology and photolithography technology. Further, the electrode conductor thin films of the thin film capacitor and the conductor pad on the surface thereof can be formed by a vapor phase film formation method, such as sputtering, or vacuum deposition, employing a metal such as Ag, Pt or Au. However, when the conductor pad is formed as a film formation layer principally comprised of Ag, Pt or Au, the aforementioned surface chemical processing cannot be applied, thereby forming the Cu-plated layer on the surface of the conductor pad. As a result, the adhesion is improved between the pad and the lowermost dielectric layer of the laminated wiring portion or the via conductor formed in the dielectric layer.

Moreover, although the thin film capacitor is formed on the main surface of the ceramic substrate serving as a base, when the conductor layers, such as those of a via or a pad, are formed inside the substrate or on a main surface (at a location where the capacitor is not formed), the conductor material used is preferably a metal having a high melting point, such as Mo or W, which does not melt or flow at a firing temperature of the substrate, depending on the ceramic material (e.g., an alumina, a silicon nitride, aluminum nitride, or the like) used for the substrate. However, when the conductor pad formed on the surface of the ceramic sub-core (at a location where the thin film capacitor is not formed) is a metallized pad principally comprised of Mo or W, surface chemical processing cannot be directly applied. Therefore, the Cu-plated layer is formed on the surfaces of the pads. As a result, the adhesion is improved between the pad and the lowermost dielectric layer of the laminated wiring portion or the via conductor formed in the dielectric layer. Further, in a preferred implementation a Ni-plated layer and a Cu-plated layer are formed, in this order on the surface of the conductor pad, whereby the Cu-plated layer is even more firmly attached or adhered to the conductor pad.

According to a second embodiment of the aspect of the invention wherein a capacitor is incorporated into the ceramic sub-core, the entire ceramic sub-core comprises a multilayer ceramic capacitor. The capacitor comprises plural first electrode conductor layers and plural second electrode conductor layers, which are isolated or separated from each other in terms of direct current, i.e., are direct current isolated. The layers are formed as alternate layers sandwiched between dielectric layers comprised of ceramic. The latter are simultaneously fired with the electrode conductor layers. Thereafter, the conductor pad connected to the multilayer ceramic capacitor is formed as a metallized pad principally comprised of Ni or Ag, and a Cu-plated layer is formed thereon. When the conductor pad formed on the multilayer ceramic capacitor is the metallized pad principally comprised of Ni or Ag, surface chemical processing cannot be directly applied, thereby forming the Cu-plated layer on the surface thereof. As a result, the adhesion is improved between the pad and the lowermost dielectric layer of the laminated wiring portion or the via conductor formed in the dielectric layer.

In accordance with a further aspect of the invention, there is provided a wiring board comprising:

a core board having two major surfaces and comprising a core main body, said core board including a sub-core housing portion comprising one of (i) a through-hole penetrating both of the major surfaces of the core board and (ii) a concave portion opening at one of said surfaces of the core board, and a ceramic sub-core having a conductor pad on a main surface thereof and accommodated in the sub-core housing portion;

a laminated wiring portion located on one major surface of the core board and comprising a plurality of dielectric layers including a via conductor formed therein and a plurality of conductor layers alternating with said dielectric layers such that the laminated wiring portion comprises alternating dielectric and conductor layers; and an overcoat layer formed on a surface of the conductor pad, a surface of the overcoat layer having a roughened face, and a said dielectric layer, of the plurality of dielectric layers of the laminated wiring portion, which is located on the core board, and a said via conductor formed in said dielectric layer, being in electrical contact with the roughened face.

According to the aspect of the present invention described above, by roughening the surface of the overcoat layer covering the surface of the conductor pad, the adhesion is improved between the pad and the lowermost or lowest dielectric layer of the laminated wiring portion or the via conductor formed in the dielectric layer. Thus, because the conductor pad firmly adheres to the lowermost dielectric layer or to the via conductor, a defect or imperfection is unlikely to occur during the manufacturing process or in the finished product.

In one preferred embodiment, the overcoat layer is comprised of a metal material. For example, the overcoat layer may comprise a plated layer (Cu-plated layer) formed by a plating method (such as electrolytic plating, chemical plating, physical vapor deposition, chemical vapor deposition, or the like). Further, in embodiments wherein the overcoat layer is comprised of the same material (e.g., a Cu-plated layer) as that of the via conductor, the adhesion therebetween will be further strengthened.

In a further preferred embodiment, a portion of the overcoat layer, which covers only an upper face of the conductor pad, serves as the roughened face. Thus, it is possible that the overcoat layer can provide sufficient adhesion between the pad and the dielectric layer or the via conductor at the roughened face of the upper face of the conductor pad, as well as providing a fully acceptable dielectric layer, i.e., one without any voids or the like occurring at the side face portion of the conductor pad. In this regard, the dielectric material easily flows to the side face portion of the conductor pad which is not roughened, thereby resulting in a "good" dielectric layer. Such a roughened face, i.e., one provided only at the upper face of the conductor pad, can be produced by mechanical grinding.

Further features and advantages of the present invention will be set forth in, or apparent from, the detailed description of preferred embodiments thereof which follows.

DESCRIPTION OF THE PREFERRED EMBODIMENTS

A First Preferred Embodiment of a Wiring Board

Figure 1:
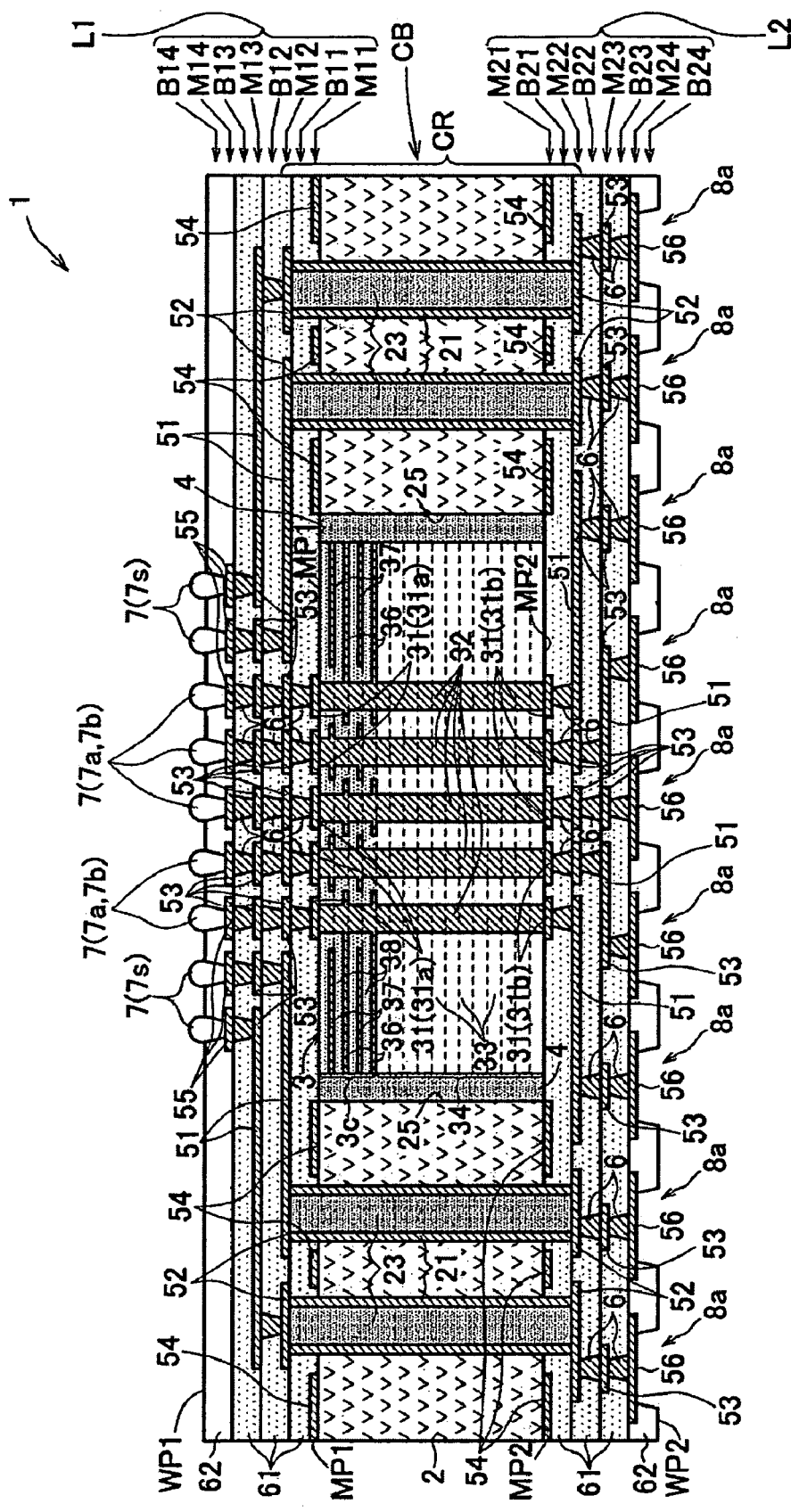
FIG. 1 is a schematic cross-sectional view of a wiring board according to one preferred embodiment of the present invention.

A first embodiment of a wiring board according to one preferred embodiment of the present invention will be described with reference to the accompanying drawings. FIG. 1 is a schematic diagram showing a cross-sectional configuration of a wiring board 1. Notably, in the present embodiment, a first main surface MP1 or WP1 of a plate-like member is assumed to be a surface on the upper side in the figure and a second main surface MP2 or WP2 is assumed to be a surface on the lower side in FIG. 1. A wiring board 1 includes a ceramic sub-core 3 having a thin film capacitor 3C which is formed at the first main surface MP1 side of a core board CB and located at a underneath area of solder bumps 7. In order to reduce in switching noise of a semiconductor integrated circuit element (IC chip) C and to stabilize an operational power supply voltage, the ceramic sub-core 3 contributes to a reduction in inductance component of the wiring by shortening the wiring length between the IC chip C and the thin film capacitor 3C. Moreover, by providing the ceramic sub-core 3 comprised of ceramic having a smaller linear expansion coefficient than that of a core main body 2 comprised of polymer material at the underneath area of the solder bump 7 in the core board CB, the difference in the linear expansion coefficient with that of the IC chip C is reduced, thereby preventing an open circuit etc. due to thermal stress. This is discussed in more detail below.

Figure 2:
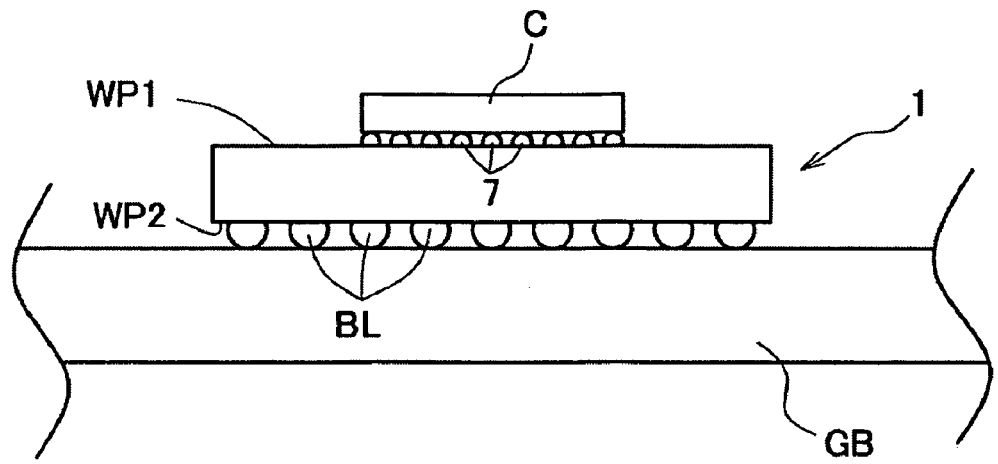
FIG. 2 is a schematic side elevational view showing a wiring board located between a semiconductor integrated circuit element (i.e., an IC chip) and a main substrate (e.g., a mother board or the like)

FIG. 2 is a diagram showing a wiring board 1 located between the IC chip C and a main board (e.g., a mother board, etc.) GB. The IC chip C has a signal terminal, a power terminal and a ground terminal in a second main surface thereof (not shown), and is flip-chip bonded to the solder bumps 7 (Pb-Sn system, Sn-Ag system, Sn-Sb system or Sn-Zn system solder etc.) that are formed on the first main surface WP1 of the wiring board 1. Moreover, in order to improve the thermal fatigue life of the solder bumps 7, an under-filling material (not shown) comprised of thermosetting resin is filled between the IC chip C and the first main surface WP1 of the wiring board 1. On the other hand, the main board (mother board etc.) GB is comprised mainly of a polymer material strengthened by ceramic particles or fibers as filler, and is connected to terminal pads 56 (see FIG. 1) by solder balls BL formed on the second main surface WP2 of the wiring board 1.

Figure 3:
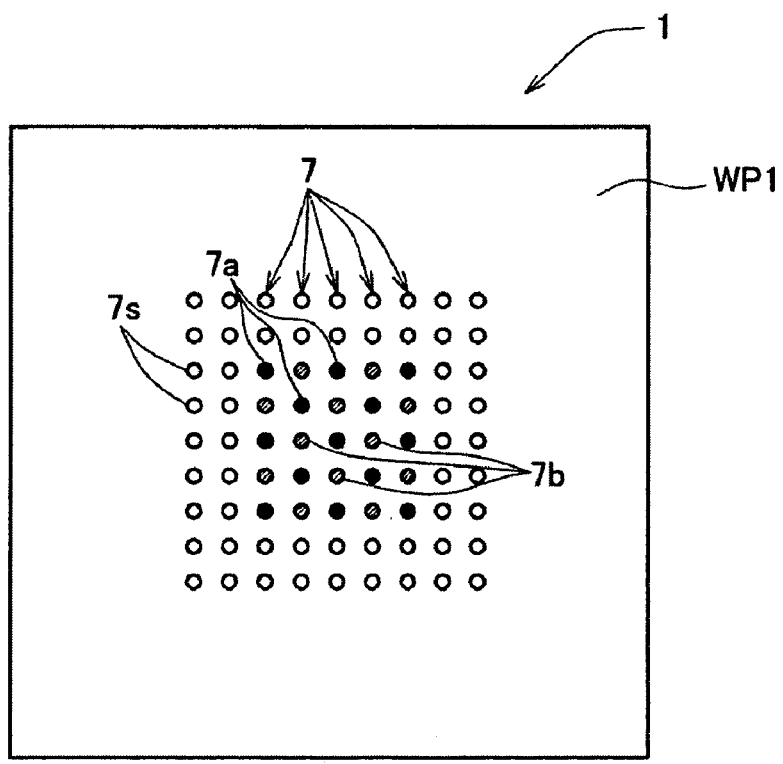
FIG. 3 is a schematic top plan view showing a first major or main surface of a wiring board.
Figure 4:
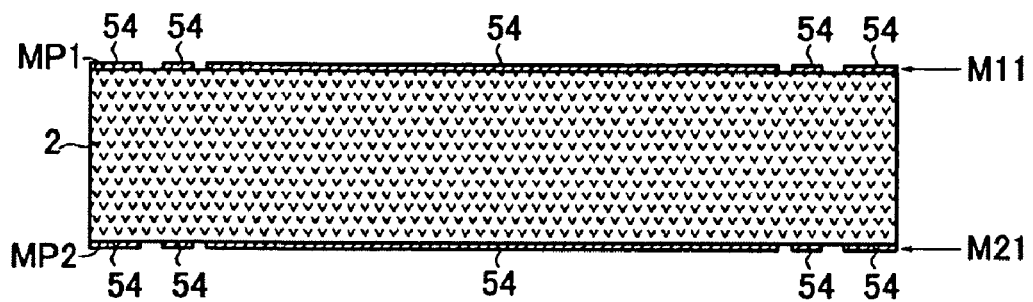
FIG. 4 is a series of schematic side elevational views showing steps in a preferred manufacturing process for a wiring board according to the present invention.
Figure 4:
Figure 4:
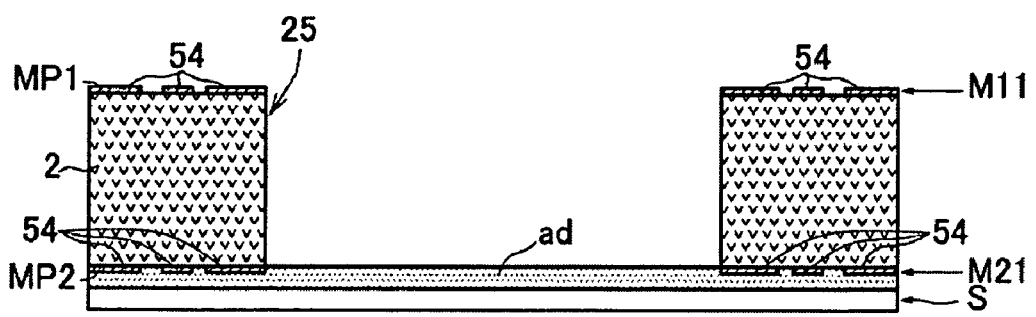

FIG. 3 is a diagram showing the first main surface WP1 of the wiring board 1. The solder bumps 7 are disposed in a grid configuration (also referred to as a staggered configuration). Power terminals 7a and ground terminals 7b are disposed in an alternating pattern in the center section and signal terminals 7s are arranged so as to surround power terminals 7a and ground terminals 7b. These terminals correspond to the terminals of the IC chip C.

The core main body 2 is constructed in the form of a sheet of heat-resistant resin board (e.g., bismareimid-triazine), fiber reinforced resin board (e.g., glass fiber reinforce epoxy resin) or the like. The core board CB is formed such that a sub-core housing portion 25 (through-hole), which penetrates the main surfaces MP1 and MP 2, is formed in the location including the underneath area of the solder bump 7, and the plate-like ceramic sub-core 3 is accommodated therein.

The ceramic sub-core 3 has a thin film capacitor 3C at the first main surface MP1 side. The thin film capacitor 3C is formed by alternately layering a plurality of dielectric thin films 38 and a plurality of electrode conductor thin films 36, 37 (also referred to herein as a first electrode conductor thin film and a second electrode conductor thin film, respectively). The electrode conductor thin films 36, 37 are divided into a power source side electrode conductor thin film corresponding to the power terminals 7a or a ground side electrode conductor thin film corresponding to the ground terminals 7b. The films 36, 37 are electrically isolated or separated from each other in terms of direct current flow, i.e., are direct current isolated from one another, and are arranged alternately in the layering direction and are separated by the dielectric thin films 38.

Such a thin film capacitor 3C may be manufactured by repeating a patterning process based on known photolithography technology and known film formation technology. The electrode conductor thin films 36, 37 may be comprised of such metal as Ag, Au or Pt (and Pt is used in the present exemplary embodiment) and are formed by a vapor phase film formation method, such as sputtering, vacuum deposition method. On the other hand, the dielectric thin films 38 may be comprised of oxide or nitride, and are formed by a vapor phase film formation method, such as RF sputtering, reactive sputtering or chemical vapor deposition (CVD). Moreover, when the dielectric thin film 38 is comprised of an oxide (a composite oxide having Perovskite type crystal structure, for example, barium titanate, strontium titanate and one or two kinds of lead titanate), film 38 may be formed by a chemical solution deposition method (CSD), so-called Sol-Gel processing method.

Figure 10:
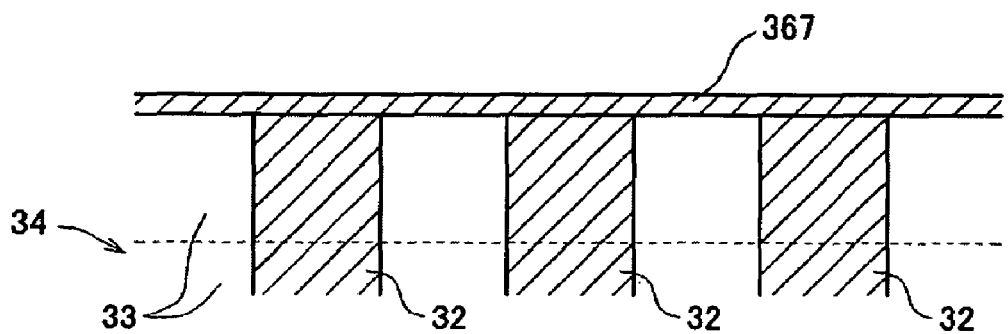
FIG. 10 is a series of side elevational views showing steps in a manufacturing process of a thin-film-capacitor portion of a wiring board in accordance with a further aspect of the invention.
Figure 10:
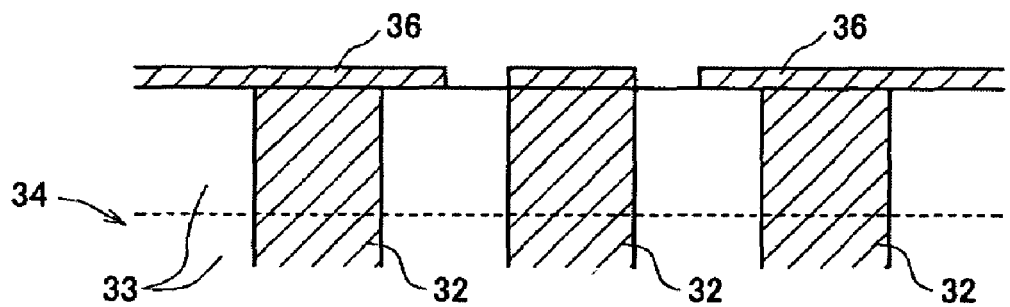
Figure 10:
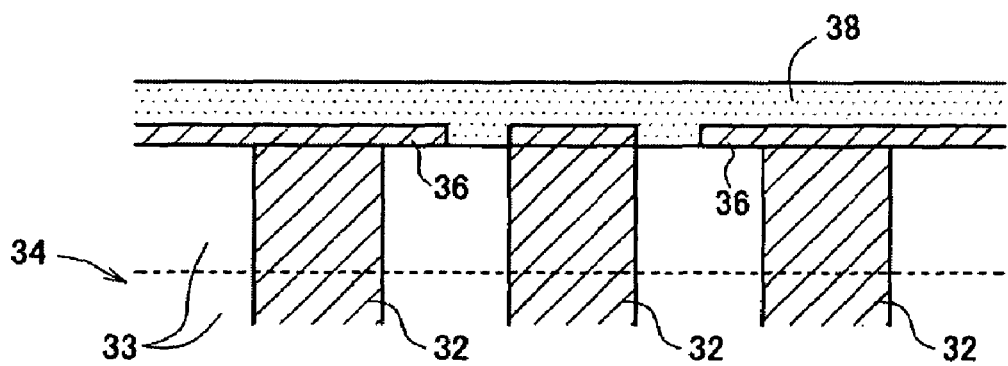
Figure 11:
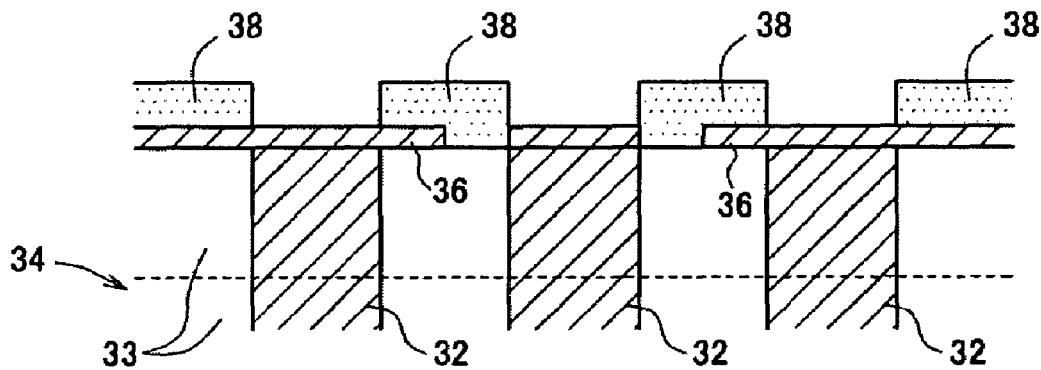
FIG. 11 is a series of side elevational views showing steps subsequent to those of FIG. 10.
Figure 11:
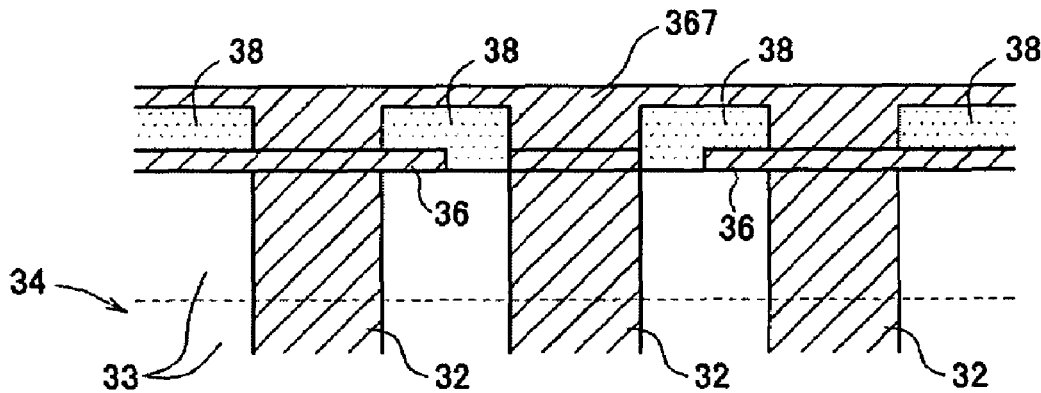
Figure 11:
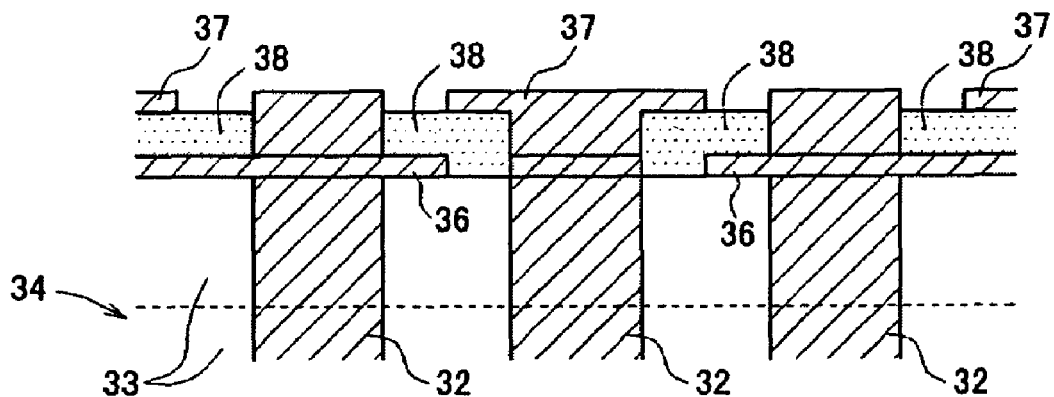
Figure 12:
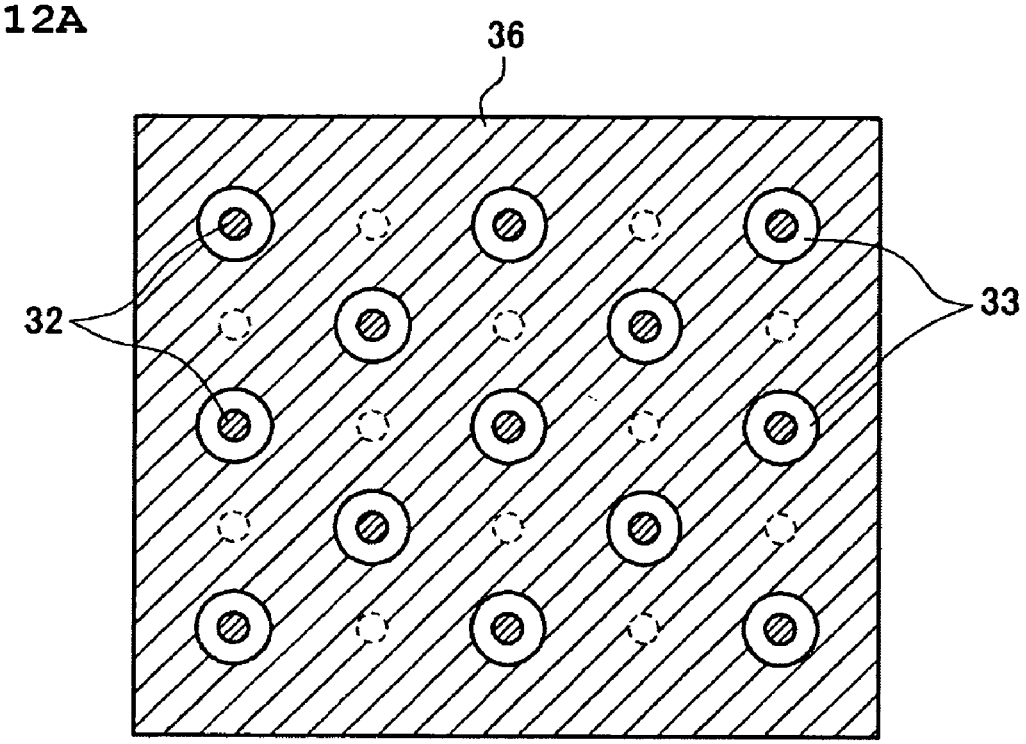
FIG. 12 is a plan view showing, in parts 12A and 12B, a thin-film-capacitor portion during the manufacture thereof.
Figure 12:
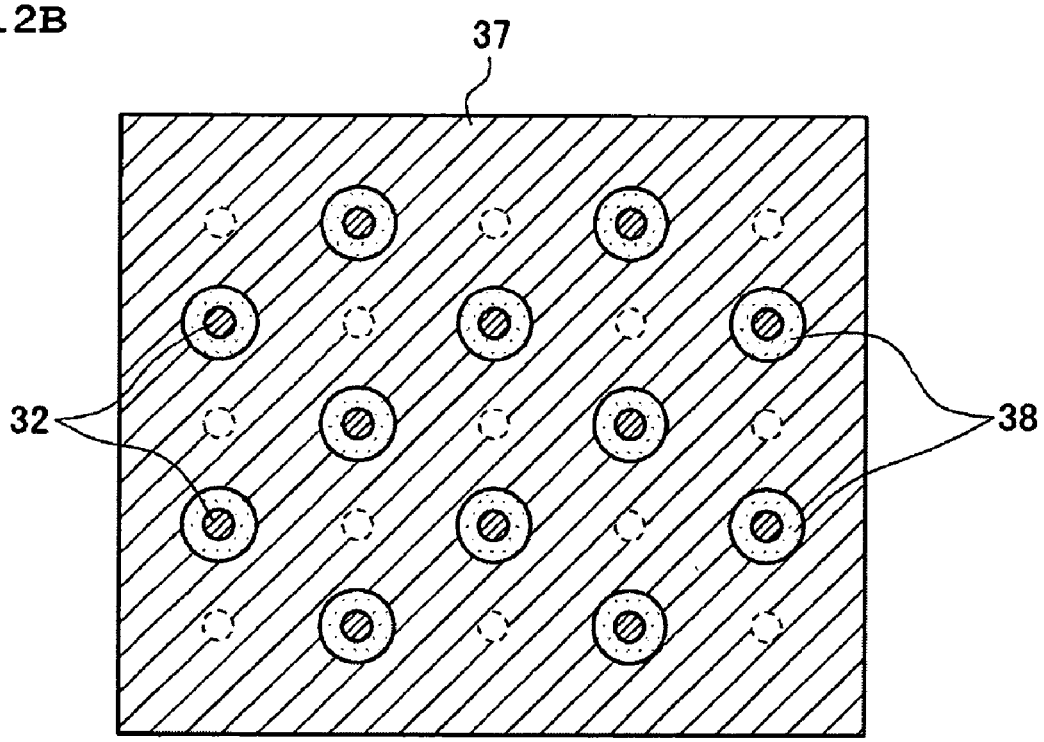

More specifically, the thin film capacitor 3C can be manufactured through the steps shown in FIGS. 10 to 12. First, in a step C1, a metal thin film 367 is formed on a main surface of a ceramic substrate 34. Then, in a step C2, the perimeters of through-hole conductors 32 corresponding to power source terminals or ground terminals in the metal thin film 367 are etched in a doughnut shape so that the through-hole conductors 32 and the electrode conductor thin film 36 are separated. This is shown in FIG. 12A, as viewed from the top. Then, the procedure proceeds to a step C3, wherein the dielectric thin film 38 is formed by, for example, the Sol-Gel processing method so as to cover the entire surface of the electrode conductor thin film 36. In a step C4, plural openings are formed in the dielectric thin film 38 at the locations corresponding to the through-hole conductors 32. Next, in a step C5, a further metal thin film 367 is formed in a similar manner to the step C1. In a step C6, the perimeters of the through-hole conductors 32 which are different from those in the step C2 are etched in the doughnut shape so as to separate the through-hole conductors 32 from the electrode conductor thin film 37. This is shown in FIG. 12B, as viewed from the top. Repeating the above steps, a plurality of dielectric thin films 38 and a plurality of electrode conductor thin films 36, 37 are alternately layered or laminated to form a laminated configuration such as that illustrated.

Similarly to the electrode conductor thin films 36, 37, a conductor pad 31a of the first main surface MP1 of the ceramic sub-core 3, which is formed together with the thin film capacitor 3C, may also be comprised of a metal such as Ag, Au or Pt (again, Pt is used in the present exemplary embodiment). The conductor pad 31a is produced by a vapor phase film formation method, such as sputtering, or vacuum deposition method (film formation layer). Further, a Cu-plated layer 31c described later is formed on the surface of the conductor pad 31a.

In the ceramic sub-core 3, the thin film capacitor 3C is formed on the ceramic substrate 34. For the ceramic substrate 34, a ceramic green sheet containing raw material powder of ceramic and metallic powder paste deposited or charged in via holes formed by punching or laser punching or the like, are layered and baked. Regarding the ceramic material of the ceramic substrate 34, it is permissible to use alumina, silicon nitride, aluminum nitride or the like, or glass ceramics produced by adding inorganic ceramic filler such as alumina to borosilicate base glass or borosilicate lead base glass, e.g., a weight portion of 40-60. Moreover, conductor pad 31b of the second main surface MP2 of the ceramic sub-core 3 and the through-hole conductors 32 are formed by a metallized portion comprised mainly of Mo or W, the paste of which can be sintered simultaneously with the ceramic material. Then, the Cu-plated layer 31c described later is formed on the surface of the conductor pad 31b.

Figure 8:
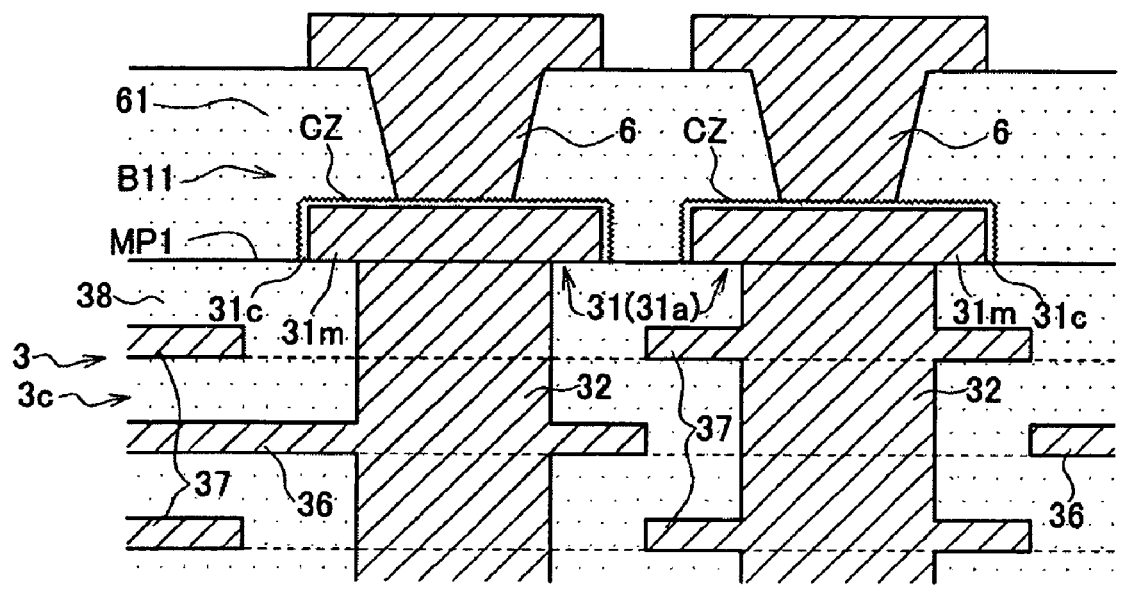
FIG. 8 is a schematic cross-sectional view showing a first preferred implementation of the plating configuration on a conductor pad surface of a ceramic sub-core.
Figure 9:
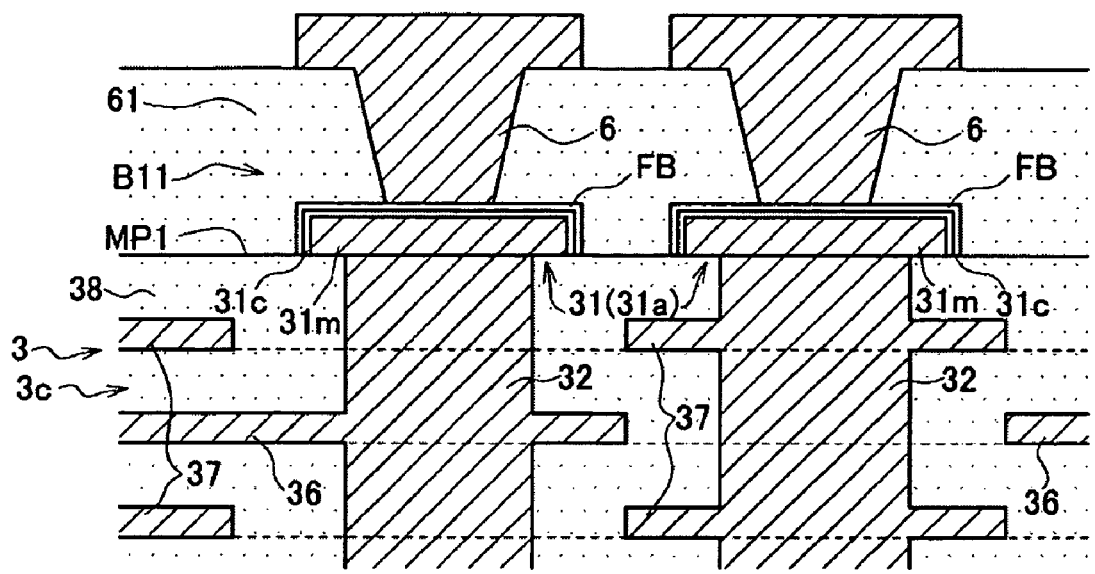
FIG. 9 is a schematic cross-sectional view showing a second preferred implementation of the plating configuration on a conductor pad surface of a ceramic sub-core.

As shown in FIGS. 8 and 9, the conductor pads 31a, 31b of the main surfaces MP1, MP2 of the ceramic sub-core 3 have the Cu-plated layer 31c thereon, respectively. (It is noted that the drawings show only the first main surface MP1 side; however, the second main surface MP2 side has the same structure.) The surfaces of the Cu-plated layers 31c are treated to become processed faces CZ, FB to which Cu surface chemical processing is applied so as to improve the adhesion thereof to polymer material. The lowest or lowermost dielectric layers B11, B21 of laminated wiring portions L1, L2 and via conductor 6 penetrating the lowest dielectric layers B11, B21 contact the processed faces CZ, FB so as to provide a good adhesion between the lowermost dielectric layers B11, B21 and the surfaces of the Cu-plated layers 31c. Moreover, since the surface of the Cu-plated layer 31c and the via conductor 6 are formed by Cu plating, the adhesion therebetween is good.

The Cu-plated layer 31c is formed by electrolytic Cu plating (barrel plating) or electroless Cu plating, typically with a thickness of about 2 μm or more to 4 μm or less. In addition, at the time of forming a roughened surface CZ as shown in FIG. 8, the thickness of the Cu-plated layer 31c is preferably about 5 μm so as to hold the thickness between 2 μm and 4 μm after a Cu roughening process (which is described later) wherein the surface of the Cu-plated layer 31c is etched in to some degree. Further, in an advantageous embodiment, a Ni-plated layer and a Cu-plated layer are formed in this order on the surface of the conductor pad 31b (which is comprised of Mo or W) of the second main surface MP2. By providing the Ni-plated layer between the conductor pad 31b and the Cu-plated layer, the adhesion therebetween is improved.

Referring to FIG. 8, in this embodiment, the processed face formed by the Cu surface chemical processing is the roughened face CZ, wherein the Cu roughening process is applied to the surface of the Cu-plated layer 31c as the Cu surface chemical processing. A known process, such as a microetching method or a black oxide treatment, can be used for the Cu roughening process. When the surface of the Cu-plated layer 31c is made the roughened face CZ, sufficient adhesion can be obtained between the lowermost dielectric layers B11, B21 of the laminated wiring portions L1, L2 and the surface of the Cu-plated layer 31c, due to an anchor effect. In order to obtain this effect, in an exemplary, preferred embodiment, the Cu roughening process is applied such that a ten point average roughness (Rz), as specified in JIS-B-0601, is preferably between about 0.3 μm and 20 μm, and more preferably between about 0.5 μm and 1.0 μm, and even more preferably between 0.5 μm and 5 μm.

Figure 15:
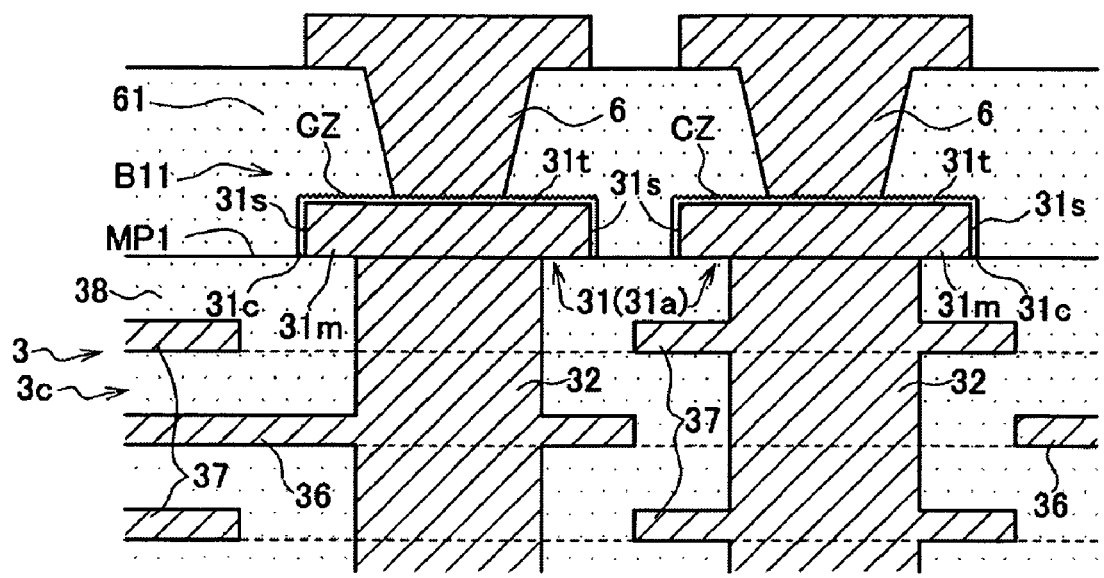
FIG. 15 is a schematic cross-sectional view showing a modification or different implementation of a plating configuration on a conductor pad surface of a ceramic sub-core in accordance with yet another aspect of the invention.

A modification of FIG. 8 is shown in FIG. 15. The Cu-plated layer (overcoat layer) 31c covering the surface of conductor pads 31a, 31b has the roughened face CZ only at a portion thereof covering an upper face 31t of the pad, and no Cu roughening process is applied to a portion covering a side face 31s of the pad. As a result, the polymer material, which constitutes the lowest dielectric layers B11, B21 of the laminated wiring portions L1, L2, easily flows between the conductor pads 31a, 31b, thereby resulting in dielectric layers B11, B21 without voids therein. Here, the "upper face" of the pad 31t refers to a face along with the main surface MP1, MP2 of the ceramic sub-core 3, and the "side face" 31s of the pad refers to a face adjacent to the upper face 31t. Thus, a mechanical grinding, for example, can be used for making only the portion covering the upper face 31t of the pad in the Cu-plated layer 31c forming the roughened face CZ.

Referring to FIG. 9, in a second embodiment of the processed face formed by the Cu surface chemical processing is a bonding layer (FB) formation face wherein the bonding layer FB comprised of an alloy containing Cu and Sn is formed on the Cu-plated layer 31c, as the Cu surface chemical processing. According to the formation process of bonding layer FB, the adhesion between the pad and the lowermost dielectric layers B11, B21 of the laminated wiring portions L1, L2 is sufficient without the need for roughening the surface of the Cu-plated layer 31c. In exemplary embodiments, the bonding layer FB may be comprised of the alloy containing a third metal (e.g., at least one chosen from Ag, Zn, Al, Ti, Bi, Cr, Fe, Co, Ni, Pd, Au and Pt) in addition to Cu and Sn. For example, in an exemplary embodiment the bonding layer FB contains Cu in the amount of between about 1 atom % and 50 atom %, Sn in an amount between about 20 atom % and 98 atom %, and a third metal in an amount between about 1 atom % and 50 atom %. Further, in order to obtain sufficient adhesion, the bonding layer FB preferably has a thickness of between about 0.001 μm and 1 μm.

Returning to FIG. 1, a filling resin 4 comprised of polymer material is charged in a space acting as a gap between the ceramic sub-core 3 and the core main body portion 2 in the sub-core housing portion 25. The filling resin 4 is comprised of an epoxy system resin containing inorganic filler, such as silica filler. The filling resin 4 fixes the ceramic sub-core 3 to the core main body portion 2 and absorbs differences in the linear expansion coefficient, both in a facial direction and a thickness direction between the ceramic sub-core 3 and the core main body portion 2 because of the filling resin 4.

The laminated wiring portions L1, L2 formed on both main surfaces MP1, MP2 of the core board CB, respectively have a configuration wherein the dielectric layers B11-B14, B21-B24 and the conductor layers M11-M14, M21-M24 are alternately layered. The conductor layers M11-M14 and M21-M24 are formed by wiring patterns 51, 53 and pads 55, 56, etc., which are made of Cu plating. The conductor layers M11-M14 and M21-M24 are connected through the via conductor 6 to form the conduction paths (for signals, power sources and ground) from the pad 55 to the pad 56. Further, the pads 55, 56 are used in forming solder bumps 7 and the solder balls BL, and a Ni—Au plating is formed on the surfaces thereof.

The dielectric layers B11-B14, B21-B24 are comprised of polymer material such as an epoxy resin, which contains an inorganic filler, such as silica powders, that can be used to adjust dielectric constant and isolation voltage. The dielectric layers B11-B13, B21-B23 are referred to as so-called build-up resin insulating layers which insulate the conductor layers M11-M14, M21-M24 where the via conductor 6 for connecting the conductor layers is formed therein. On the other hand, the dielectric layers B14, B24 are solder resist layers having the openings for exposing the pads 55, 56.

Moreover, the core main body portion 2 of the core board CB and the dielectric layers B11, B21 have through-holes therein. Through-hole conductors 21 used for electrically connecting the laminated wiring portions L1, L2 are formed on inner walls of these through-holes. The through-hole conductors 21 correspond to signal terminals 7s. A filling material 23 comprised of an epoxy system resin containing an inorganic filler, such as silica filler, is charged inside the through-hole conductors 21, and an end portion of the through-hole conductor 21 is provided with a lid conductor 52 made of Cu plating. In addition, the region from the conductor layers M12 to M22 including the core board in the center is referred to as a core region and is denoted CR, and the through-hole conductor 21 and the lid conductor 52 are formed therein.

A Second Preferred Embodiment of a Wiring Board

Figure 13:
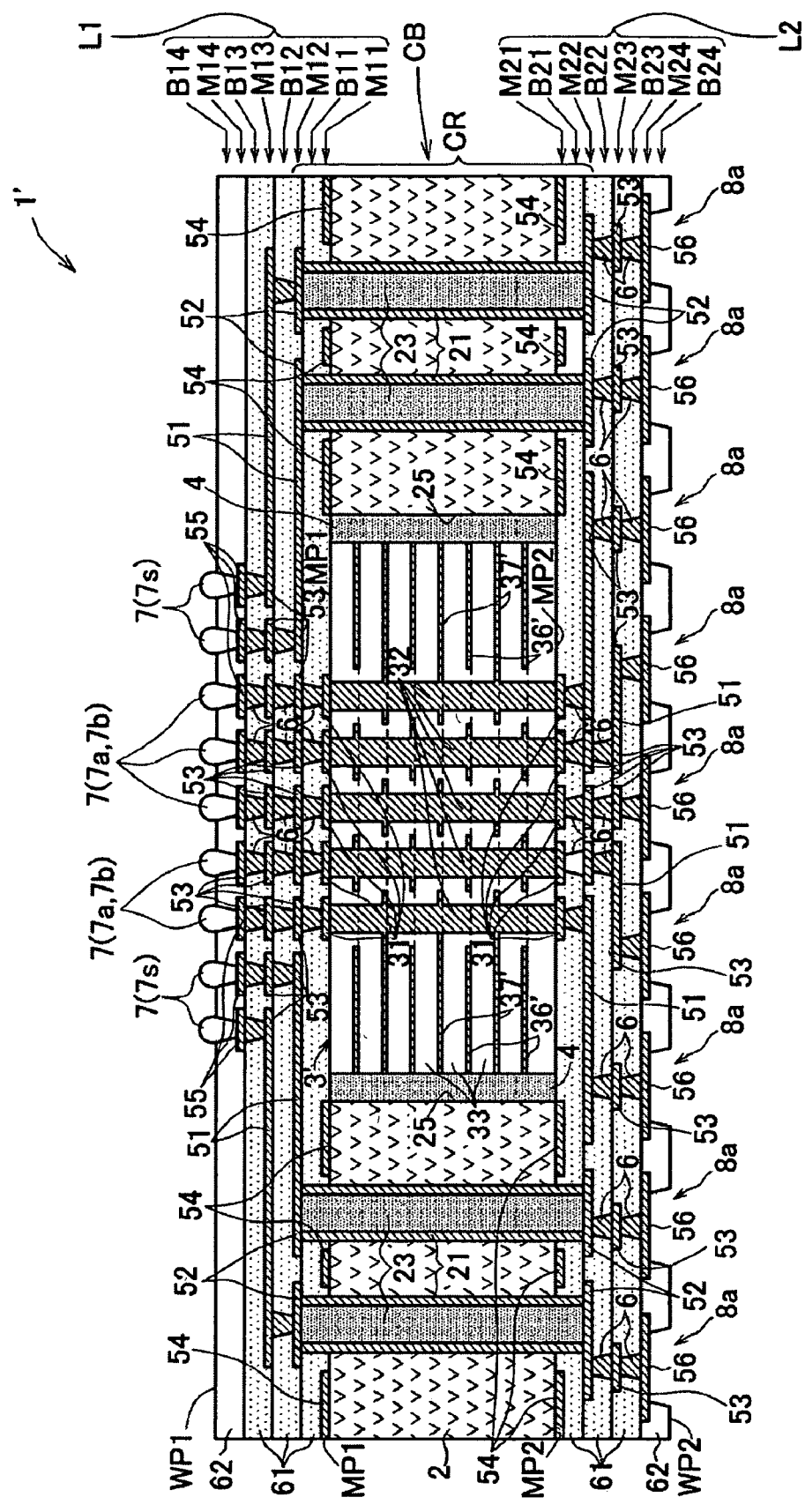
FIG. 13 is a schematic cross-sectional view of a wiring board according to a second preferred embodiment of the invention.

Hereinafter, the second embodiment of the wiring board according to the present invention (wiring board 1') will be described. Only the parts or portions of wiring board 1' that are different from that of the wiring board 1 will be described. The same reference numerals are used for components constructed in the same manner as the wiring board 1 and any detailed description thereof is omitted. The structure of a wiring board 1', as shown in FIG. 13, is such that the whole ceramic sub-core 3' functions as a multilayer ceramic capacitor. This multilayer ceramic capacitor has the same lamination structure as that of the thin film capacitor 3C according to the first embodiment (i.e., the capacitor of the wiring board 1). Two kinds of electrode conductor layers 36', 37' (also referred to as a first electrode conductor layer and a second electrode conductor layer, respectively) are alternately layered in the layering direction such that these layers are separated or electrically isolated in terms of direct current by ceramic layers 33 (which are also referred to as dielectric layers). The electrode conductor layer 36' at a power source side corresponds to a power terminal 7a, the electrode conductor layer 37' at a ground side corresponds to a ground terminal 7b.

Figure 14:
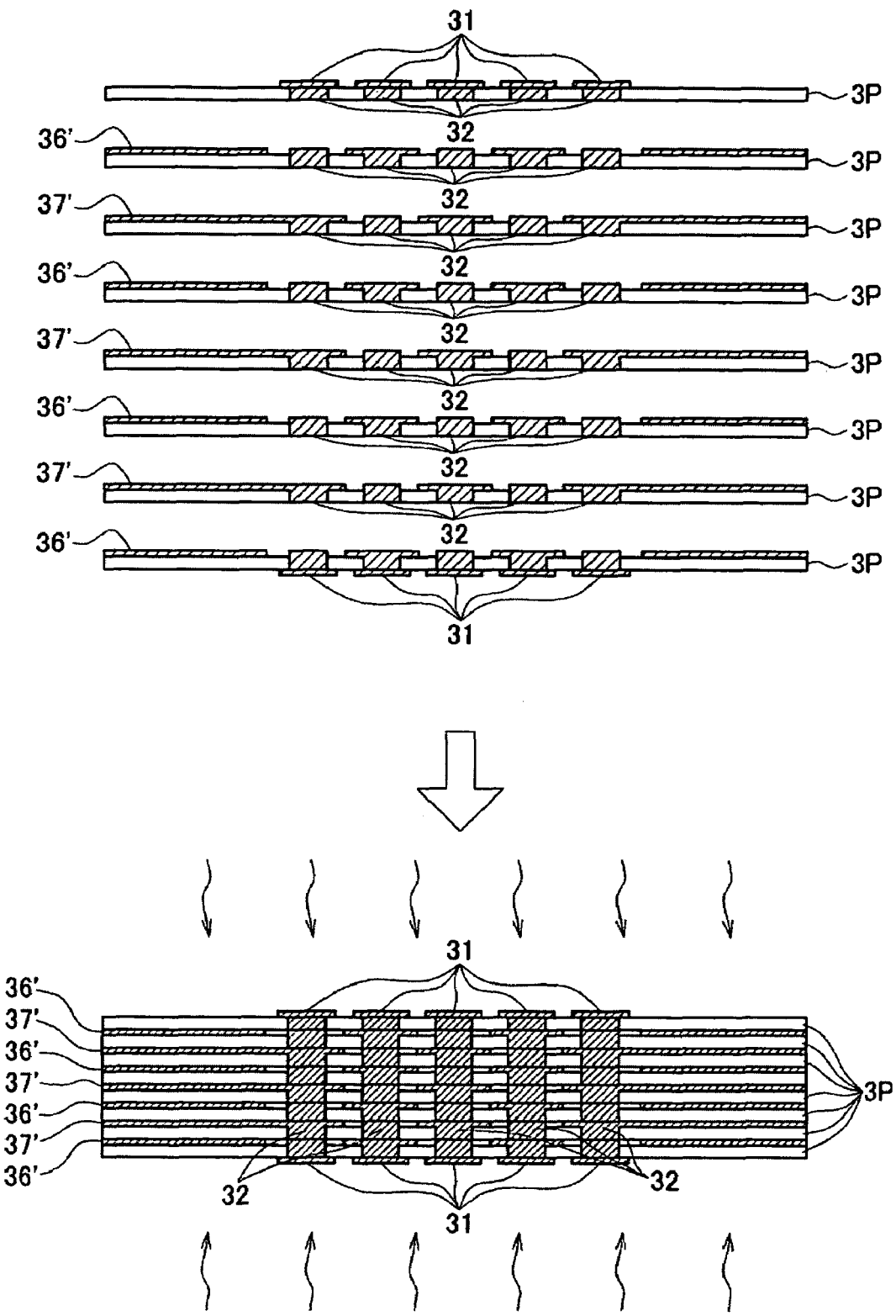
FIG. 14 is a schematic side elevational view showing two steps in a manufacturing process for a multilayer ceramic capacitor in accordance with a further aspect of the invention.

Considering this construction in more detail, a ceramic sub-core 3' comprised of such a multilayer ceramic capacitor is a multilayer capacitor formed such that the electrode conductor layers 36', 37' and the ceramic layers 33 (which are comprised of the same ceramic material as that of the ceramic substrate 34 according to the first embodiment), which are simultaneously fired with the electrode conductor layers 36', 37', are alternately layered. That is, as shown in FIG. 14, the ceramic sub-core 3' is produced in the following manner. Plural ceramic green sheets serving as the ceramic layers 33 are mechanically punched or laser punched to form though-holes therein, and a metal paste comprised mainly of Ni or Ag is applied thereto to form through-hole conductors 32 and the electrode conductor layers 36', 37'. The thus-produced individual ceramic substrates 3P are laminated to thereby form a laminated portion, and subsequently, this laminated portion is subjected to a firing process. Each electrode conductor layer 36' and each electrode conductor layer 37' is connected, respectively, in the laminating direction, through the through-hole conductor 32, which serves as a via, and are individually formed at the time of the pattern printing of the metal paste. Accordingly, the conductor pad 31 of both main surfaces MP1, MP2 of the ceramic sub-core 3' are formed as metallized pads, which are comprised mainly of Ni or Ag and obtained by simultaneously firing a metal powder paste with the ceramic materials. Then, the Cu-plated layer 31c is formed on the surface of the conductor pad 31 as described above.

A Preferred Method for Manufacturing a Wiring Board

Next, a preferred embodiment of a method for manufacturing a wiring board according to the present invention will now be described with reference to accompanying drawings. FIGS. 4 to 7 show process steps for manufacturing the wiring board 1.

In a step 1, a conductor pattern 54 (conductor layers M11, M21) is formed on both main surfaces MP1, MP2 of the core main body portion 2, respectively. The conductor pattern 54 formed such that a heat-resistant resin board (e.g., a bismareimid-triazine resin board) or a fiber reinforced resin board (e.g., made of a glass fiber reinforced epoxy resin), which has a copper film on both major or main surfaces thereof, is pattern etched using a mask.

In a step 2, a through-hole penetrating the main surfaces MP1, MP2 is formed by a drill machining process to form a sub-core housing portion 25. Further, a roughening process, which preferably uses potassium permanganate or the like, is applied to a side wall of the sub-core housing portion 25 (through-hole) to thereby improve the adhesion thereof to a filling resin 4 that is filled later. Furthermore, an organic-system compound (coupling agent) may be applied to the side wall.

In a step 3 (referred to as a blocking step), an opening at the second main surface (MP2) side of the sub-core housing portion 25 (through-hole) is blocked by a sheet S having an adhesive material "ad" on its top face so that the adhesive material "ad" is exposed inside the sub-core housing portion 25. The adhesive material "ad" of the sheet S preferably has an adhesion of 80N/25 mm or more (measured by a 180° peeling method (JIS Z 0237)). The units (N/25 mm) used here is the force measured by using a sheet having a width of 25 mm as a sample. The material (referred to as a base material) used for the sheet S may be a resin sheet, such as polyester, a polyimide, PET or the like. Furthermore, for example, a silicon-system adhesive, an acryl-system adhesive, a thermoplastic-rubber-system adhesive or the like may be used for the adhesive material "ad" applied to the top face of the sheet S.

In a step 4 (referred to as a sub-core housing step), the ceramic sub-core 3 is mounted from the opening of the first main surface MP1 of the sub-core housing portion 25 and fixed to the adhesive material "ad." The ceramic sub-core 3 may be accurately accommodated in the sub-core housing portion 25 using conventional known mounting equipment. The Cu-plated layer 31c is formed on the surface of the conductor pad 31 of the ceramic sub-core 3 in advance (in what is referred to as a pad plating step). The plating structure of the surface of the conductor pad 31 is, as described above, such that the Cu-plated layer 31c is directly formed on the surface of the conductor pad 31 (see FIGS. 8 and 9). The formation method, the thickness and the like, of the Cu-plated layer 31c are described above.

In a step 5 (referred to as a charging and curing step), the filling resin 4 is charged between the core main body 2 and the ceramic sub-core 3 and hardened. The filling resin 4 is charged by means of a conventional revolving or rotating dispenser DS. After charging the filling resin 4, air bubbles contained in the filling resin 4 are extracted by the vacuum degassing. Subsequently, the filling resin 4 is heated, dried and hardened (a so-called curing step). Further, after the curing process for curing the filling resin 4, the filling resin 4 is subjected to a roughening process using potassium permanganate, or the like, so as to improve the adhesion thereof to the dielectric layers B11, B21 which will be formed later.

Figure 5:
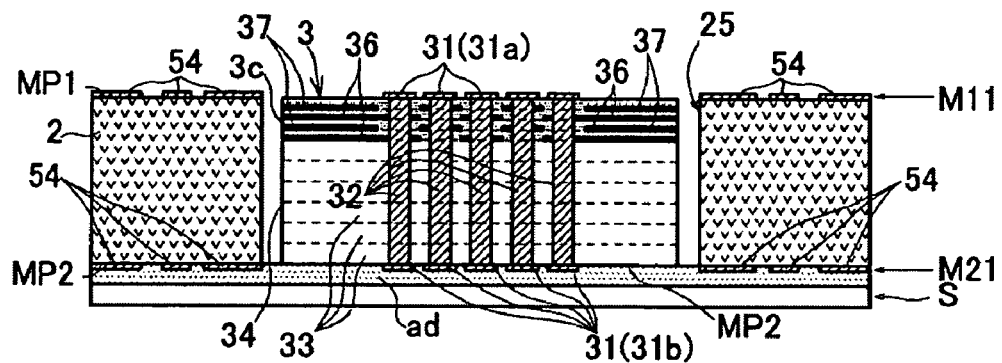
FIG. 5 is a side elevational view of the board showing steps subsequent to the steps of FIG. 4.
Figure 5:
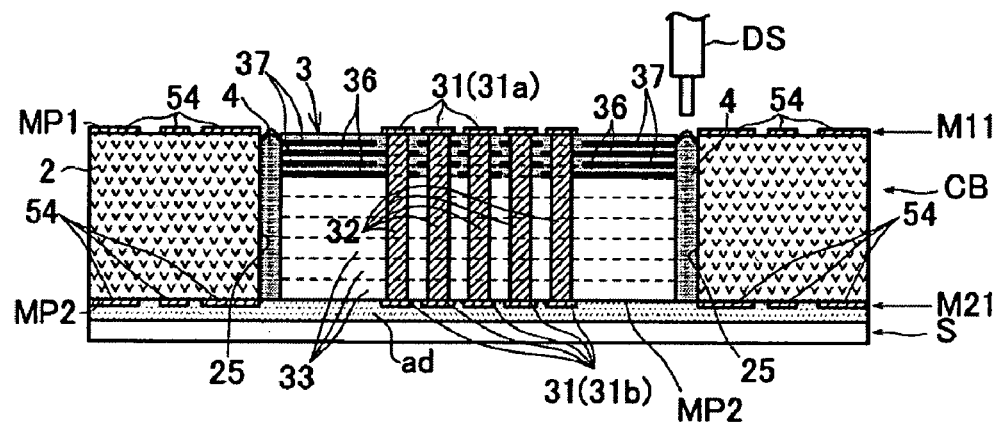
Figure 5:
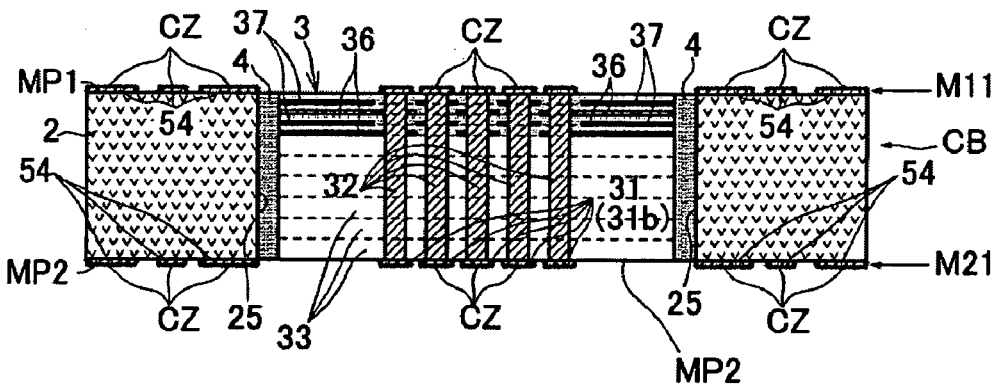
Figure 6:
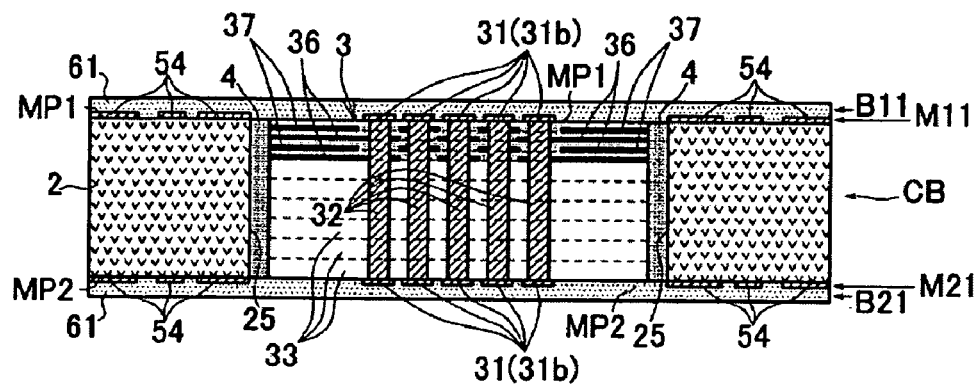
FIG. 6 is a side elevational view of the board showing steps subsequent to the steps of FIG. 5.
Figure 6:
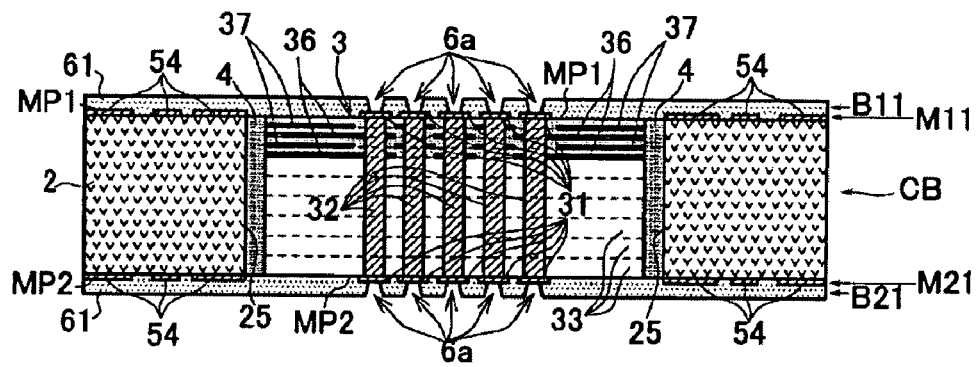
Figure 6:
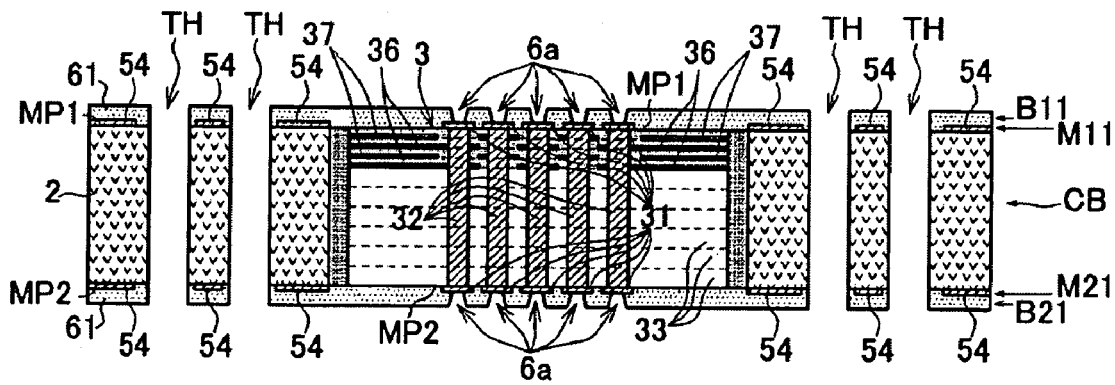
Figure 7:
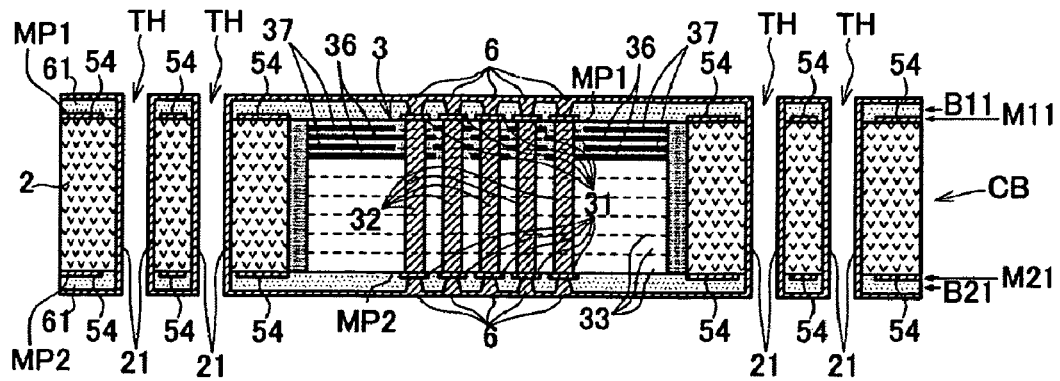
FIG. 7 is a side elevational view of the board showing steps subsequent to the steps of FIG. 6.
Figure 7:
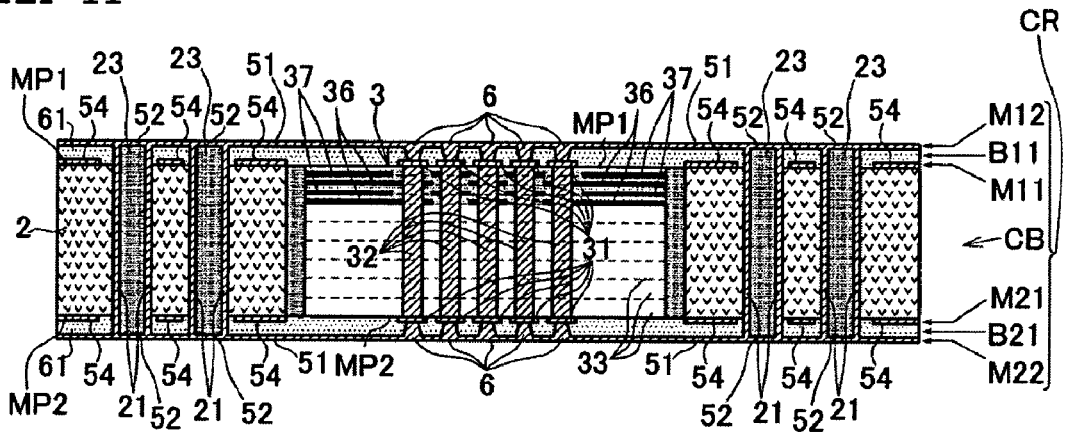
Figure 7:
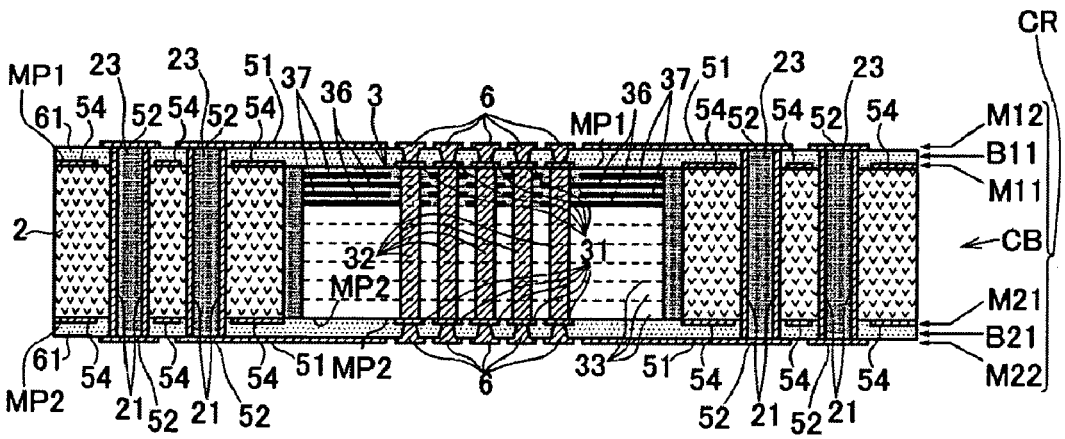

In a step 6 (referred to as a surface processing step), the Cu surface chemical processing for improving the adhesion to the polymer material is applied to the Cu-plated layer 31c, which is formed on the surface of the conductor pad 31. In the same time, the Cu surface chemical processing is also applied to the surfaces of the conductor patterns 54, which are formed on both main surfaces MP1, MP2 of the core main body portion 2. FIG. 5 shows the surface of the Cu-plated layer 31c serving as or constituting the roughened face CZ to which the Cu roughening process (which is preferably a known micro-etching method, black oxide treatment, or the like) is applied. However, as described above, the bonding layer FB comprised of the alloy containing Cu and Sn may be formed on the surface of the Cu-plated layer 31c. In addition, this step may be performed before the step 4 (i.e., the sub-core housing step) so that the ceramic sub-core 3 having the conductor pad 31 to which the Cu surface chemical processing is applied may be accommodated in the sub-core housing portion 25.

A step 7, and the subsequent steps described below, constitute or represent the wiring laminating steps of this preferred embodiment of the method of the present invention. Namely, the dielectric layers B11-14, B21-24 and the conductor layers M12-M14, M22-M24 are alternately layered on the main surfaces MP1, MP2 of the core board CB in which the ceramic sub-core 3 is accommodated to thereby form laminated wiring portions L1, L2. This is achieved by using a known build-up process (such as a semi-additive method, full-additive method, subtractive method, and a formation of dielectric layers by laminating film-like resin materials, using photolithography technology, or the like).

First, in step 7, the dielectric layers B11, B21 are layered respectively on the main surfaces MP1, MP2 of the core board CB in which the ceramic sub-core 3 is accommodated. At this time, since the Cu surface chemical processing is applied to the surface of the conductor pad 31 of the ceramic sub-core 3, the adhesion therebetween is sufficient. Next, in a step 8, via holes 6a are formed in the dielectric layers B11, B21, preferably by a laser via process or a photovia process or the like. As a result, the conductor pad 31 is exposed at the bottom of via hole 6a. Further, after forming the via holes 6a, a desmear process (i.e., a resin residue removal processing step) is performed using potassium permanganate or the like, to clean the surface of the conductor pad 31.

Next, in a step 9, through-holes TH are formed, with a drill or the like, so as to penetrate through the dielectric layers B11, B21 and the conductor layers M11, M21, which are formed on the main surfaces MP1, MP2 of the core board CB, in the thickness direction of the board. In a step 10, the Cu plating (i.e., the electrolytic Cu plating performed after electroless Cu plating) is applied to the entire surface of the core board CB to fill the through holes 6a, thereby forming via conductor 6. In the same time, through-hole conductors 21 are formed in the inner circumferences of the through-holes TH. Then, a filling material made of resin 23 is charged in the through-hole conductors 21, and the Cu plating is further applied to the entire surface of the core board CB to thereby form lid conductors 52. It is noted that the thermal stress which tends to be generated at the time of a solder reflow process or the like can be reduced or alleviated because the via conductor 6 is formed by the same Cu plating as that applied to the surface of the Cu-plated layer 31c of the conductor pad 31, thereby resulting in preventing the occurrence of an open circuit.

Next, in a step 12, the Cu plating covering the dielectric layers B11, B21 is etched to form wiring patterns 51 etc. As a result, the aforementioned core-region CR is obtained. Similarly, the dielectric layers B12-B14, B22-B24 and the conductor layers M13, M14, M23, M24 are alternately layered, and the openings are formed in the dielectric layers B14, B24, preferably by a laser via process or a photovia process, to expose pads 55, 56. Subsequently, a Ni-Au plating or layer is applied to the surface of the pads 55, 56, and solder bumps 7 are formed on the pads. Finally, after predetermined inspections, such as an electrical inspection and a visual inspection, the wiring board 1 shown in FIG. 1 is completed.

Although the invention has been described above in relation to preferred embodiments thereof, it will be understood by those skilled in the art that variations and modifications can be effected in these preferred embodiments without departing from the scope and spirit of the invention.

What is claimed:

1. A wiring board, comprising:
   a core board having major surfaces and comprising a core main body comprised of a sheet of polymer material and a ceramic sub-core formed of a sheet of ceramic, said core board including a sub-core housing portion comprising one of (i) a through-hole penetrating both major surfaces of the core board and (ii) a concave portion open at one of the major surfaces of the core board, said ceramic sub-core being received in said sub-core housing portion; and
   a laminated wiring portion disposed on one of the major surfaces of the core board and comprising a plurality of dielectric layers comprised of a polymer material and a plurality of conductor layers alternating with said dielectric layers such that the laminated wiring portion comprises alternating dielectric and conductor layers;
   the ceramic sub-core including a capacitor, and a conductor pad formed on one major surface thereof so that one surface of the conductor pad is disposed on said one major surface, said conductor pad being electrically connected to said capacitor,
   the wiring board further comprising a Cu-plated layer formed on the conductor pad so as to entirely cover the surfaces thereof apart from said one surface of said conductor pad, at least the entire upper surface of said Cu-plated layer comprising a processed face processed by surface chemical processing so as to enhance adhesion between the processed face of the Cu-plated layer and the polymer material of said dielectric layers, and
   a lowermost dielectric layer of the laminated wiring portion, and a via conductor formed in the lowermost dielectric layer, being in electrical contact with the processed face.

2. A wiring board as claimed in claim 1, wherein the processed face comprises a roughened face to which a Cu roughening process is applied as said surface chemical processing.

3. A wiring board as claimed in claim 1, wherein the processed face comprises a bonding layer formation face to which a bonding layer, comprised of an alloy containing Cu and Sn, is applied as said surface chemical processing.

4. A wiring board as claimed in claim 1, wherein the conductor pad comprises a metal material principally comprised of a metal other than Cu.

5. A wiring board as claimed in claim 1, wherein the conductor pad is principally comprised of Cu and at least one further metal, and has a lower Cu content than that of the Cu-plated layer.

6. A wiring board as claimed in claim 1, wherein said capacitor of the ceramic sub-core comprises a thin film capacitor disposed on one major surface of said sub-core, and said thin film capacitor comprising a plurality of first electrode conductor thin films and a plurality of second electrode conductor thin films, said thin conductor films being direct current isolated from each other, and each having dielectric thin films alternately sandwiched therebetween, and
   wherein the conductor pad is disposed on a surface of the thin film capacitor and comprises a film formation layer principally comprised of one of Ag, Pt and Au, and wherein the Cu-plated layer is formed thereon.

7. A wiring board as claimed in claim 1 wherein the ceramic sub-core, in its entirety, comprises a multilayer ceramic capacitor comprising a plurality of first electrode conductor layers and a plurality of second electrode conductor layers, said electrode conductor layers of said multilayer ceramic capacitor being direct current isolated from each other, each including dielectric layers, comprised of ceramic, alternately sandwiched therebetween, and
   the conductor pad being connected to the multilayer ceramic capacitor and comprising a metallized pad principally comprised of one of Ni and Ag, and said Cu-plated layer being disposed on said metallized pad.

8. A wiring board as claimed in claim 4, wherein the conductor pad is principally comprised of at least one metal selected from the group consisting of Ag, Pt, Au, Ni, Mo and W.

9. A wiring board, comprising:
   a core board having two major surfaces and comprising a core main body, said core board including a sub-core housing portion comprising one of (i) a through-hole penetrating both of the major surfaces of the core board and (ii) a concave portion opening at one of said surfaces of the core board, and a ceramic sub-core having a conductor formed pad on a main surface thereof such that one surface of the conductor pad is disposed on said main surface and accommodated in the sub-core housing portion;
   a laminated wiring portion located on one major surface of the core board and comprising a plurality of dielectric layers including a via conductor formed therein and a plurality of conductor layers alternating with said dielectric layers such that the laminated wiring portion comprises alternating dielectric and conductor layers; and
   an overcoat layer formed on the conductor pad so as to entirely cover the surface of the conductor pad apart from said one surface and to thus present an outer face including an upper portion opposed to said one surface, and, at least the upper portion of the outer face of the overcoat layer having a roughened surface, and a said dielectric layer, of the plurality of dielectric layers of the laminated wiring portion, which is located on the core board, and a said via conductor formed in said dielectric layer, being in electrical contact with the roughenedsurface.

10. A wiring board as claimed in claim 9, wherein said roughened surface is limited to the upper portion of the outer face of the overcoat layer.

11. A wiring board as claimed in claim 9, wherein the overcoat layer is comprised of Cu.

12. A wiring board as claimed in claim 11, wherein the conductor pad comprises a metal material principally comprised of a metal other than Cu.

13. A wiring board as claimed in claim 11, wherein the conductor pad is principally comprised of Cu and at least one further metal, and has a lower Cu content than that of the Cu-plated layer.

14. A wiring board as claimed in claim 11, wherein said capacitor of the ceramic sub-core comprises a thin film capacitor disposed on one major surface of said sub-core, and said thin film capacitor comprising a plurality of first electrode conductor thin films and a plurality of second electrode conductor thin films, said thin conductor films being direct current isolated from each other, and each having dielectric thin films alternately sandwiched therebetween, and wherein the conductor pad is disposed on a surface of the thin film capacitor and comprises a film formation layer principally comprised of one of Ag, Pt and Au, and wherein the Cu-plated layer is formed thereon.

15. A wiring board as claimed in claim 11, wherein the ceramic sub-core, in its entirety, comprises a multilayer ceramic capacitor comprising a plurality of first electrode conductor layers and a plurality of second electrode conductor layers, said electrode conductor layers of said multilayer ceramic capacitor being direct current isolated from each other, each including dielectric layers, comprised of ceramic, alternately sandwiched therebetween, and the conductor pad being connected to the multilayer ceramic capacitor and comprising a metallized pad principally comprised of one of Ni and Ag, and said Cu-plated layer being disposed on said metallized pad.

16. A wiring board as claimed in claim 12, wherein the conductor pad is principally comprised of at least one metal selected from the group consisting of Ag, Pt, Au, Ni, Mo and W.

* * * * *